(12) United States Patent
Mouli

(10) Patent No.: US 7,608,903 B2
(45) Date of Patent: Oct. 27, 2009

(54) IMAGE SENSOR WITH SOI SUBSTRATE

(75) Inventor: Chandra Mouli, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 162 days.

(21) Appl. No.: 11/730,892

(22) Filed: Apr. 4, 2007

(65) Prior Publication Data

US 2007/0246756 A1 Oct. 25, 2007

Related U.S. Application Data

(62) Division of application No. 11/178,799, filed on Jul. 12, 2005, now Pat. No. 7,271,025.

(51) Int. Cl.
*H01L 31/113* (2006.01)

(52) U.S. Cl. ............... 257/431; 257/290; 257/291; 257/292; 257/461; 257/466; 257/E27.13; 257/E27.131; 257/E27.133; 257/E27.134; 257/E27.137

(58) Field of Classification Search ............... 438/57, 438/59, 153, 154, 200; 257/290, 291, 292, 257/302, 431, 440, 447, 460, 461, 462, 463, 257/464, E27.13, E21.131, E27.132, E27.133, 257/E27.134, E27.135
See application file for complete search history.

(56) References Cited

U.S. PATENT DOCUMENTS

| | | | |
|---|---|---|---|
| 4,575,462 A | 3/1986 | Dobson et al. | |
| 5,953,582 A | 9/1999 | Yudasaka et al. | |
| 6,140,630 A | 10/2000 | Rhodes | |
| 6,204,524 B1 | 3/2001 | Rhodes | |
| 6,310,366 B1 * | 10/2001 | Rhodes et al. | 257/185 |
| 6,326,652 B1 | 12/2001 | Rhodes | |
| 6,333,205 B1 | 12/2001 | Rhodes | |
| 6,376,868 B1 | 4/2002 | Rhodes | |
| 6,465,786 B1 | 10/2002 | Rhodes | |
| 6,818,930 B2 | 11/2004 | Rhodes et al. | |
| 6,878,568 B1 | 4/2005 | Rhodes et al. | |
| 6,930,336 B1 * | 8/2005 | Merrill | 257/292 |
| 6,949,445 B2 | 9/2005 | Rhodes et al. | |
| 7,105,906 B1 * | 9/2006 | Hopper et al. | 257/440 |
| 7,132,724 B1 * | 11/2006 | Merrill | 257/440 |
| 7,145,190 B2 * | 12/2006 | Yaung et al. | 257/233 |
| 7,166,880 B2 * | 1/2007 | Merrill et al. | 257/294 |
| 7,521,776 B2 * | 4/2009 | Cannon et al. | 257/627 |
| 2001/0004117 A1 * | 6/2001 | Chikamatsu et al. | 257/229 |
| 2002/0121655 A1 | 9/2002 | Zheng et al. | |
| 2003/0094654 A1 * | 5/2003 | Christensen et al. | 257/347 |

(Continued)

OTHER PUBLICATIONS

Marczewski, J., et al. Monolithic Silicon Pixel Detectiors in SOI Technology; Presented by Jacek Marczewski, Prague, Nov. 15-18, 2002.

(Continued)

*Primary Examiner*—Kiesha L Rose
*Assistant Examiner*—Eric Ward
(74) *Attorney, Agent, or Firm*—Dickstein Shapiro LLP

(57) ABSTRACT

An imager pixel utilizing a silicon-on-insulator substrate, a photodiode in said substrate below the buried oxide, and a dual contact to said photodiode and methods of forming said imager pixel. The photodiode has an increased fill factor due to its increased size relative to the pixel.

20 Claims, 13 Drawing Sheets

U.S. PATENT DOCUMENTS

| | | | | |
|---|---|---|---|---|
| 2003/0219950 A1* | 11/2003 | Lyding et al. | | 438/301 |
| 2004/0161868 A1 | 8/2004 | Hong | | |
| 2005/0045926 A1 | 3/2005 | Mouli | | |
| 2005/0145848 A1 | 7/2005 | Mouli | | |
| 2005/0145902 A1 | 7/2005 | Mouli | | |
| 2005/0205930 A1* | 9/2005 | Williams, Jr. | | 257/347 |
| 2005/0212045 A1* | 9/2005 | Tamai | | 257/347 |
| 2006/0125038 A1* | 6/2006 | Mabuchi | | 257/447 |

OTHER PUBLICATIONS

SOI Research Group; SOI; Peking University, Institute of Microelectronics; http://www.ime.pku.edu.cn/soi/en/introduction1.htm; May 17, 2005.

Burns, James, et al. 3D Circuit Integration Technology for Multiproject Fabrication; MIT Lincoln Laboratory, Lexington, MA, 02173; Apr. 1, 2000.

* cited by examiner

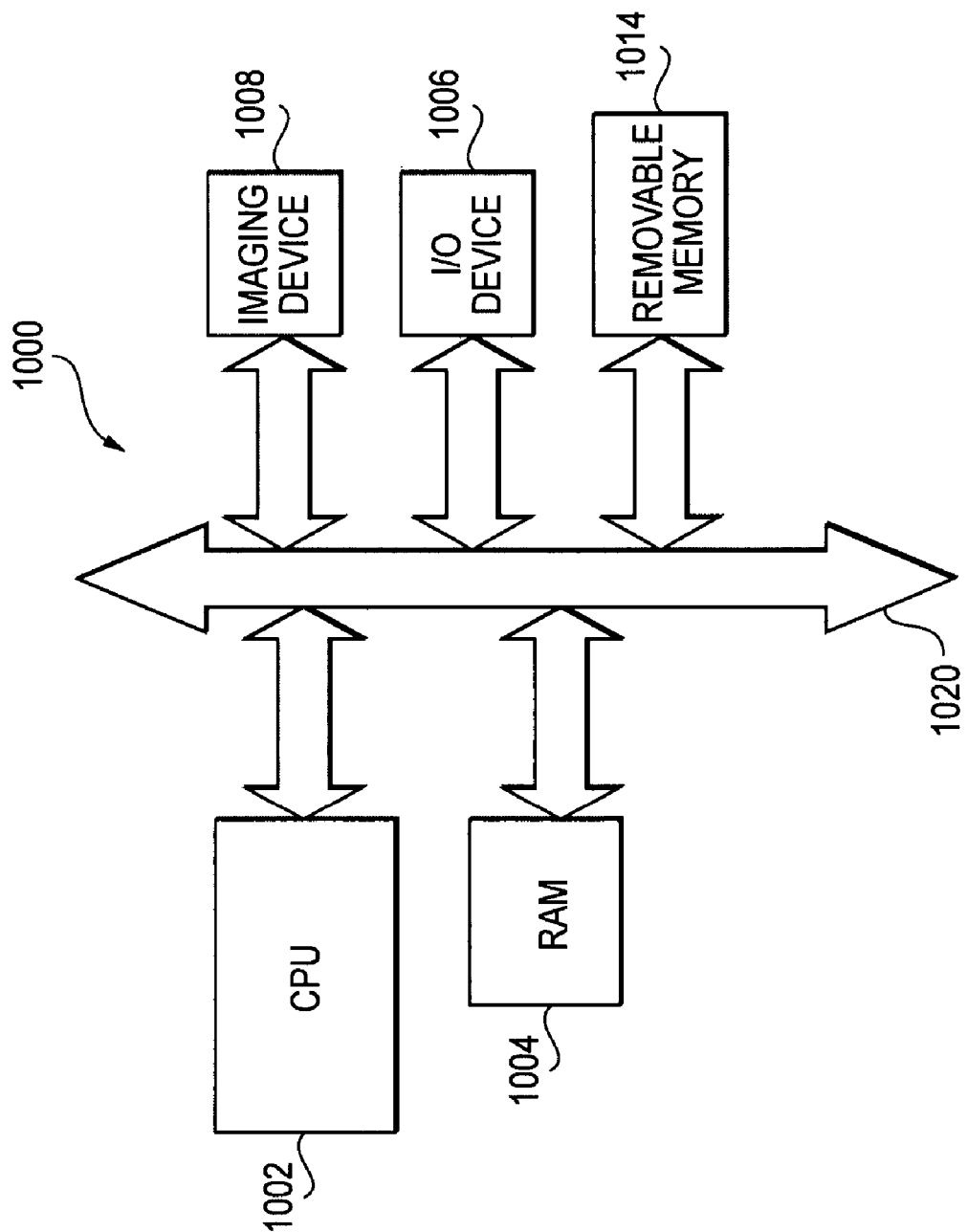

IMAGE SENSOR WITH SOI SUBSTRATE

This application is a divisional of U.S. patent application Ser. No. 11/178,799, filed Jul. 12, 2005, now U.S. Pat. No. 7,271,025 the entirety of which is incorporated by reference.

FIELD OF THE INVENTION

The invention relates to imager technology. In particular, the invention relates to imager devices with an SOI substrate.

BACKGROUND OF THE INVENTION

CMOS imagers are known in the art. Exemplary CMOS imaging circuits, processing steps thereof, and detailed descriptions of the functions of various CMOS elements of an imaging circuit are described, for example, in U.S. Pat. No. 6,140,630, U.S. Pat. No 6,376,868, U.S. Pat. No 6,310,366, U.S. Pat. No 6,326,652, U.S. Pat. No 6,204,524, and U.S. Pat. No 6,333,205, each assigned to Micron Technology, Inc. The disclosures of the forgoing patents are hereby incorporated by reference in their entirety.

A top-down and cross-sectional view of a typical and exemplary CMOS four-transistor (4T) pixel cell 10 is illustrated in FIGS. 1a and 1b. As it will be described below, the CMOS sensor pixel 10 includes a photoconversion device 12 (e.g., photo-generated charge accumulating area) in a portion of the substrate 14. This area 12 can be a pinned photodiode (FIG. 1b). The pinned photodiode is termed "pinned" because the potential in the photodiode is pinned to a constant value when the photodiode is fully depleted. It should be understood, however, that the pixel 10 may also typically include a photogate or other image to charge converting device, in lieu of a pinned photodiode, as the initial accumulating area 12 for a photoconversion device.

The pixel 10 of FIG. 1a has a transfer gate 16 for transferring photoelectric charges generated in the charge accumulating region 12 to a floating diffusion region (sensing node) 18. The floating diffusion region 18 is connected 24 to a gate 22 of a source follower transistor. The source follower transistor provides an output signal to a row select access transistor having gate 26 for selectively gating the output signal to terminal 28. A reset transistor having gate 20 resets the floating diffusion region 18 from a supply voltage applied at a source/drain region 30 between gates 20 and 22 to a specified charge level before each charge transfer from the charge accumulating region 12. The pixel 10 is typically isolated from other like cells of an imager array by shallow trench isolation regions 32. As shown in FIG. 1a, the charge accumulation region 12 of the pixel 10 is somewhat limited in area by the area taken up by the associated pixel circuitry.

A cross-sectional view of the exemplary pixel 10 of FIG. 1a taken along line a-a' is illustrated in FIG. 1b. The charge accumulating region 12 is formed as a pinned photodiode, which has a photosensitive region or p/n/p junction formed by a p-type layer 34, an n-type region 36 and the underlying p-type substrate 14. The pinned photodiode includes two p-type regions 14, 34 so that the n-type photodiode region 36 is fully depleted at a pinning voltage. The floating diffusion region 18 adjacent the transfer gate 16 and the source/drain region 30 are preferably n-type and are formed in a p-well 40 in the substrate 14. Also shown in FIG. 1b is contact 24, which connects the floating diffusion region 18 with the source follower transistor gate 22 (FIG. 1a at 24) and contact 38, which connects the source/drain region 30 with a voltage supply.

Generally, in CMOS image sensors such as the pixel 10 of FIGS. 1a and 1b, incident light causes electrons to collect in region 36. A maximum output signal, which is produced by the source follower transistor having gate 22, is proportional to the number of electrons to be extracted from the region 36. The maximum output signal increases with increased electron capacitance or acceptability of the region 36 to acquire electrons. The electron capacity of pinned photodiodes typically depends on the doping level of the image sensor and the dopants implanted into the active layer.

CMOS imagers typically suffer from poor signal to noise ratios and poor dynamic range as a result of the inability to fully collect and store the electric charge collected in the region 36. Since the size of the pixel electrical signal is very small due to the collection of photons in the photo array, it would be desirable for the signal to noise ratio and dynamic range of the pixel to be as high as possible. Additionally, as semiconductor devices are scaled down, more efficient pixel configurations are desirable to maximize photoconversion device size and minimize the area required for the related pixel circuitry.

Silicon-on-insulator (SOI) substrates are increasingly being used in high performance CMOS integrated circuits. For system on chip (SOC) applications that demand a significant amount of logic circuitry, SOI can offer benefits in power efficiency, low parasitic capacitance, and high switching speeds. In SOI technology, a layer of $SiO_2$ (or $Si_3N_4$), referred to as the buried oxide (BOX), is beneath an active silicon layer, formed either through a high dose oxygen implantation and subsequent annealing (Separation by Implantation of Oxygen, or SIMOX), or by bonding two oxidized silicon wafers together (BESOI) and then etching-back one of those wafers until a thin layer of silicon remains above the oxide layer where the two wafers had been joined. A CMOS process is typically implemented on these wafers, in which the insulating BOX layer drastically reduces leakage currents, eliminates the problem of latchup (parasitic bipolar action as a result of the n/p/n and p/n/p junctions formed by the various implants used for the CMOS process), and the reduction of RF parasitics, since the devices now sit on an insulating layer. Image sensors could benefit from such advantages over typical substrates; however, integrating an image sensor array into SOI technology has proven difficult.

BRIEF SUMMARY OF THE INVENTION

An exemplary embodiment of the invention includes a CMOS imager (i.e., image sensor) pixel that utilizes a silicon-on-insulator, i.e., SOI, substrate and a photosensor (e.g., pinned photodiode) that substantially spans the pixel area of the substrate, which provides for a large fill factor. A dual contact can be utilized to connect the photodiode with the pixel circuitry above. The substrate surrounding the dual contact can be doped p-type to reduce dark current.

In an exemplary embodiment of the invention, the buried oxide of the SOI substrate can be doped to provide various characteristics for the pixel.

The substrate of the pixel below the buried oxide can comprise an epi layer to provide epi substrate benefits for the imager. Optionally, the epi layering can be a graded. The epi portion of the substrate can also include complimentary layers.

In an exemplary embodiment of the invention, the pixel is isolated from other like pixels of an array by STI. In an alternative embodiment, the pixel is isolated from other pixels by a diffused isolation region.

In an exemplary embodiment of the invention, the pixel senses light from the side of the wafer where the pixel circuitry is positioned, i.e., the front side. In an alternative embodiment, the pixel senses light from the opposite side of the wafer, i.e., the back side.

In an exemplary embodiment of the invention, the pixel comprises multiple photodiodes to sense multiple colors of light. These photodiodes are stacked within the substrate below the BOX layer. Two or more such photodiodes can be utilized.

These and other features of the invention will be better understood from the following detailed description, which is provided in connection with the accompanying drawings.

BRIEF DESCRIPTION OF THE DRAWINGS

FIG. 12 shows a processor system incorporating at least one imager constructed in accordance with an embodiment of the invention.

DETAILED DESCRIPTION OF THE INVENTION

Although this invention will be described in terms of certain exemplary embodiments, other embodiments will be apparent to those of ordinary skill in the art, which also are within the scope of this invention. Accordingly, the scope of the invention is defined only by reference to the appended claims.

The terms "substrate" or "wafer" are used interchangeably in the following description. A silicon-on-insulator (SOI) substrate is used in accordance with the invention, which may also include epitaxial layers of silicon supported by a base semiconductor foundation. When reference is made to a substrate or wafer in the following description, previous process steps may have been utilized to form regions or junctions in or over a base semiconductor or foundation.

The term "pixel" refers to a photo-element unit cell containing a charge accumulating photoconversion device and associated transistors for converting electromagnetic radiation to an electrical signal. The pixels discussed herein are illustrated and described as 4T (4 transistors) CMOS pixel circuits for the sake of example only. It should be understood that the invention is not limited to a four transistor (4T) pixel or CMOS technology, but may be used with other pixel arrangements having fewer (e.g., 3T) or more (e.g., 5T) than four transistors and other imager technology. Although the invention is described herein with reference to the architecture and fabrication of one pixel, it should be understood that this is representative of a plurality of pixels as typically would be arranged in an imager array having pixels in rows and columns. The following detailed description is, therefore, not to be taken in a limiting sense, and the scope of the present invention is defined only by the appended claims.

Figure 2:
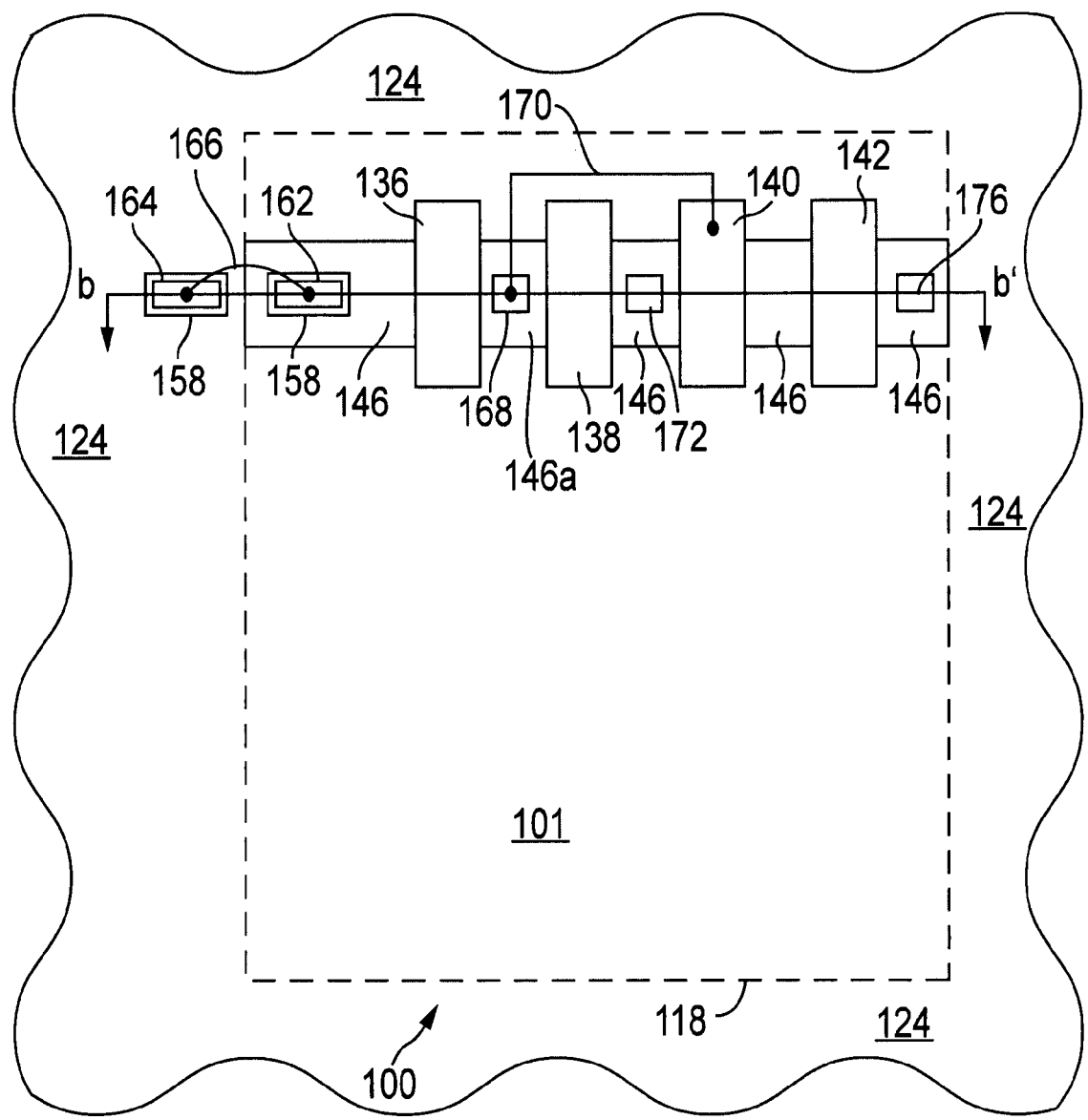
FIG. 2 shows a pixel in accordance with an embodiment of the invention.
Figure 3:
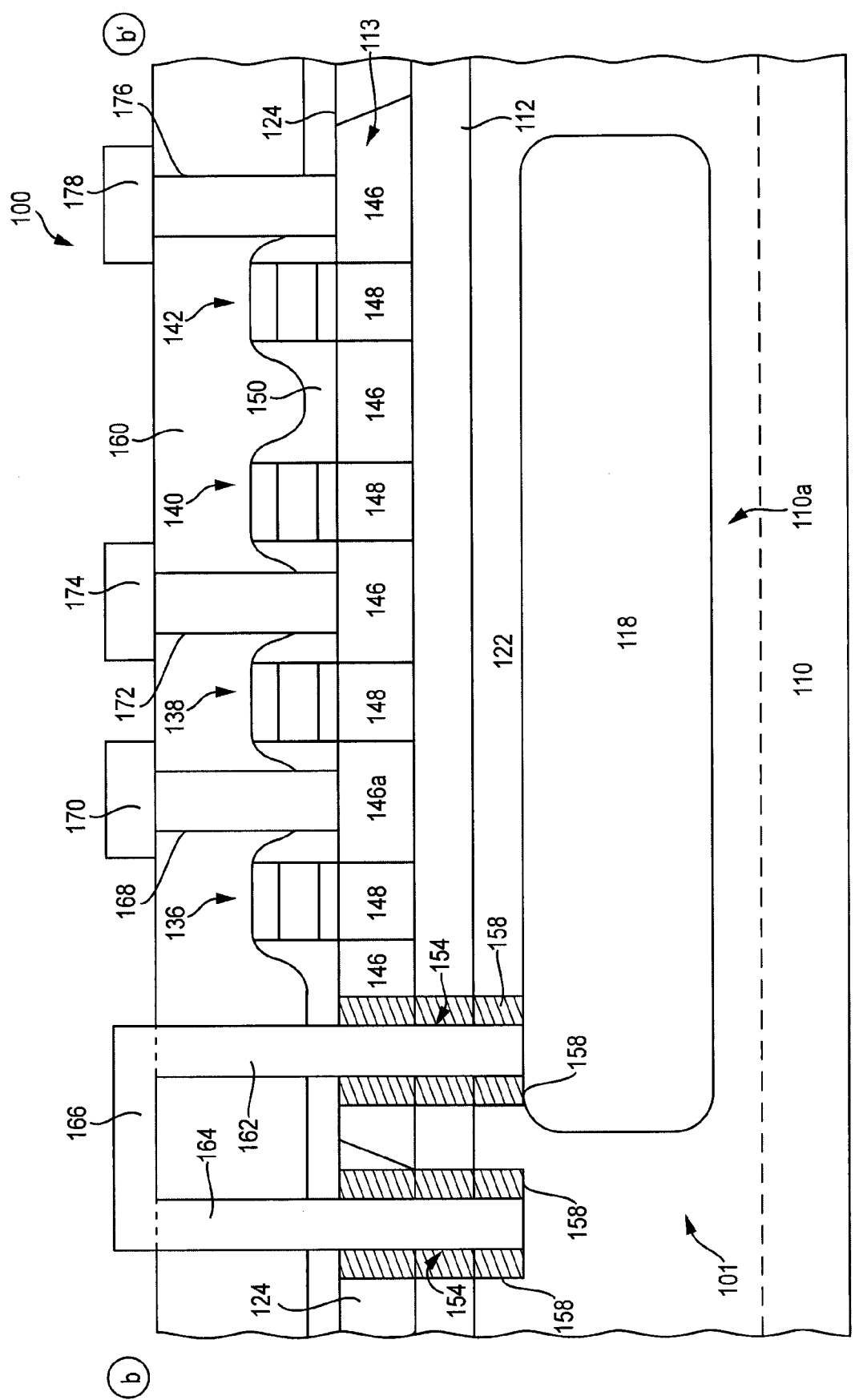
FIG. 3 shows the pixel of FIG. 2 in cross-section through line b-b'.

The invention will now be explained with reference to the accompanying figures wherein like reference numbers are used consistently for like features throughout the drawings. FIG. 2 is a top-down view of an exemplary CMOS pixel 100 constructed in accordance with the invention, while FIG. 3 is a cross-sectional view of pixel 100 along line b-b'. The pixel 100 has a pinned photodiode 101 as a charge accumulation photoconversion device. The photodiode 101 is represented in FIGS. 2 and 3 by its n-type region 118, which covers an area of the substrate corresponding to substantially the entire pixel 100 area. The photodiode 101 can occupy up to 95% or more of the total pixel area, relative to the substrate. This large photodiode 101 area, relative to the associated pixel circuitry, provides a large fill factor for the pixel 100.

The pixel circuitry, supported by a thin (typically about 1,000 Å to about 1,500 Å thick) silicon layer 113 over a buried oxide (BOX) 112 (FIG. 3), which can be about 2,000 Å to about 3,000 Å thick, includes a transfer transistor having gate 136, a reset transistor having gate 138, a source follower transistor having gate 140, and a row select transistor having gate 142. Associated with these gates (136, 138, 140, and 142) are source/drain active areas 146, one of which is a floating diffusion region 146a.

The charge collection n-type region 118 of the photodiode 101 is electrically connected with the transfer transistor (having gate 136) by contact 162. Contact 162, which can be tungsten, polysilicon, or other conductive material, is configured to penetrate through the source/drain region 146 adjacent the transfer transistor gate 136 to the SOI substrate 110 beneath the BOX layer 112 (FIG. 3). The contact 162 can be surrounded by a doped p-type region 158 of the substrate 110, which retains the pinned characteristics of the photodiode 101 and mitigates dark current in the pixel 100, but does not interfere with the charge transfer from the photodiode 101 to the transfer transistor. Contact 162 is connected by a conductive strap 166 to a second contact 164, which also penetrates the SOI substrate, but outside the photodiode 101 region through the STI (or diffused isolation) region 124. The conductive strap 166 and contacts 162 and 164 connect the substrate 110 and the charge accumulating n-type region 118 of the photodiode (FIG. 3), which provides the pinning effect for the photodiode 101; the electrical connection between the dual contacts 162 and 164 ensures that the same electrical potential exists in both the photodiode 101 portion of the substrate 110 and in the p-well portion of the substrate 110. A p-type doped region 158 of the substrate 110 can also surround contact 164.

Also shown in FIGS. 2 and 3 are contacts to the pixel transistors. The source/drain region between the transfer transistor gate 136 and the reset transistor gate 138 is considered a floating diffusion region 146a of the pixel 100 and has contact 168 and interconnect line 170 connected thereto, which electrically connects the floating diffusion region 146a to the source follower transistor gate 140. Between the reset transistor gate 138 and the source follower gate 140 is a contact 172, which connects the floating diffusion region 146a of pixel 100 to a voltage source (e.g., $V_{aa}$) for resetting the floating diffusion region 146a to a reset state. Connected to the source/drain region 146 adjacent the row select transistor gate 142 is contact 176, which connects the output of the row select transistor to a column signal read-out circuit.

Referring again to FIG. 3, the substrate 110 is semiconductor based (e.g., silicon) and can optionally be p-on-p+ epi material (a suitable option for a typical p/n/p photodiode), where the optional p+ epi layer 110a is formed over the underlying substrate 110, and the p+ epi can be a graded-epi layer. Alternatively, a complimentary epi substrate having n-on-n+ epi (suitable for a n+/p/n photodiode) can be used, having optional n+ epi layer 110a, which can also be graded. Epi (epitaxial) substrates are beneficial here because they provide lower carrier lifetime for electrons, which are minority carriers in the p+ region, which reduces cross talk between pixels.

The lower substrate 110 can typically have p-type conductivity, making it a part of the photodiode 101. FIG. 3 shows the n-type region 118 of the photodiode 101, which defines the area of the photodiode 101, which is shown in FIG. 2 as spanning substantially the entire pixel 100 area. Over the n-type region 118 is a p-type layer 122, which can be provided by making the BOX 112 boron-rich or otherwise formed by dopant (e.g., boron) implantation below the BOX 112. Over the BOX 112 is the active area of the wafer, which can be a thin silicon film 113 about 500 Å to about 5,000 Å thick, preferably about 1,000 Å to about 1,500 Å thick. The active area of each pixel of the array, of which the pixel 100 is a part, can be isolated by STI regions 124. Alternatively, diffused isolation (STI-free) can be used for isolating pixels, which mitigates dark current. A diffused isolation region (area 124) would occupy some of the wafer volume occupied by the STI region 124 in FIG. 3. The diffused isolation region (i.e., 124) is an area of the wafer heavily doped with p-type dopant to prevent current leakage between pixels.

The BOX 112 can be made boron-rich so as to provide a p-type layer 122 over the n-type region 118 for the photodiode 101 by the diffusion out of the p-type dopant into the underlying substrate 110, as indicated in the preceding paragraph. Alternatively, the BOX 112 can be deuterium-rich (by implantation), which provides passivation of the semiconductor interface, since deuterium will passivate by ensuring that any dangling silicon bonds do not contribute to the electrical charge states in the pixel. Deuterium is a superior option to hydrogen in this regard since it is a heavier isotope of hydrogen. Alternatively, the BOX 112 can be fluorine-rich; also for passivation.

The thin silicon film layer 113 over the BOX 112 supports the transistors (e.g., transfer, reset, source follower, and row select) of the pixel 100. These transistors have associated transfer transistor gate 136, reset transistor gate 138, source follower transistor gate 140, and row select transistor gate 142. Between these gates (136, 138, 140, and 142) are n-type source/drain active regions 146 (including floating diffusion region 146a), which can be fully depleted (source/drain regions 146 extend to the BOX 112), as shown, or partially depleted (source/drain regions 146 extend partially to the BOX 112. Between the source/drain regions 146 and under the gates (136, 138, 140, 142) are channel regions 148 for the transistors. A thin insulator spacer material 150 can be layered over the substrate for protection and electrical isolation of the transistor gates. 100. As another alternative, region 124 can also be formed by LOCOS. An implant 126 is performed to form a p-well 128 in the silicon layer 113 (over the BOX 112).

Figure 7:
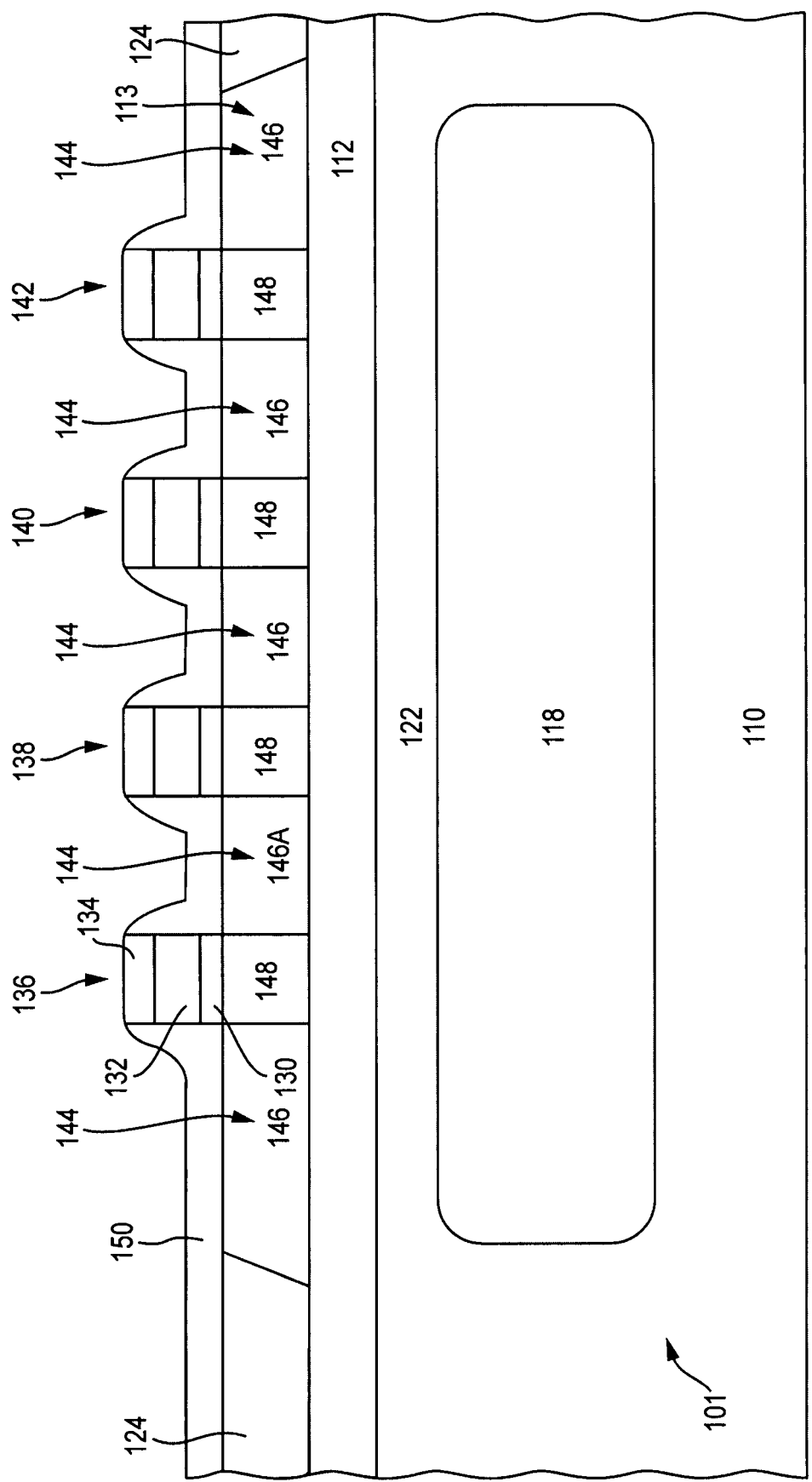

STI region 124 and p-well 128 formation is followed by conventional transistor formation over the silicon layer 113, as shown in FIG. 7. An oxide layer 130 is formed over the wafer; this will be the gate oxides for the resulting transistors. This is followed by formation of a conductive material layer 132, e.g., doped poly or tungsten, which will be the gate electrodes. An insulative material layer 134, such as nitride, is formed over the conductive material layer 132 to serve as an insulative and protective cap for the transistor gates. These layers, 130, 132, 134, are then patterned, e.g., with photoresist, and etched to leave gate stacks 136 (transfer transistor gate), 138 (reset transistor gate), 140 (source follower transistor gate), and 142 (row select transistor gate). After defining the gates (136, 138, 140, 142) source/drain regions 146 are formed by n-type dopant implant 144. An insulative film is then formed over the gates (136, 138, 140, 142) and wafer and etched back to leave an insulative layer and sidewalls 150 over the wafer and on the sides of the gates (136, 138, 140, 142). Periphery devices can also be formed at this time.

Figure 8:
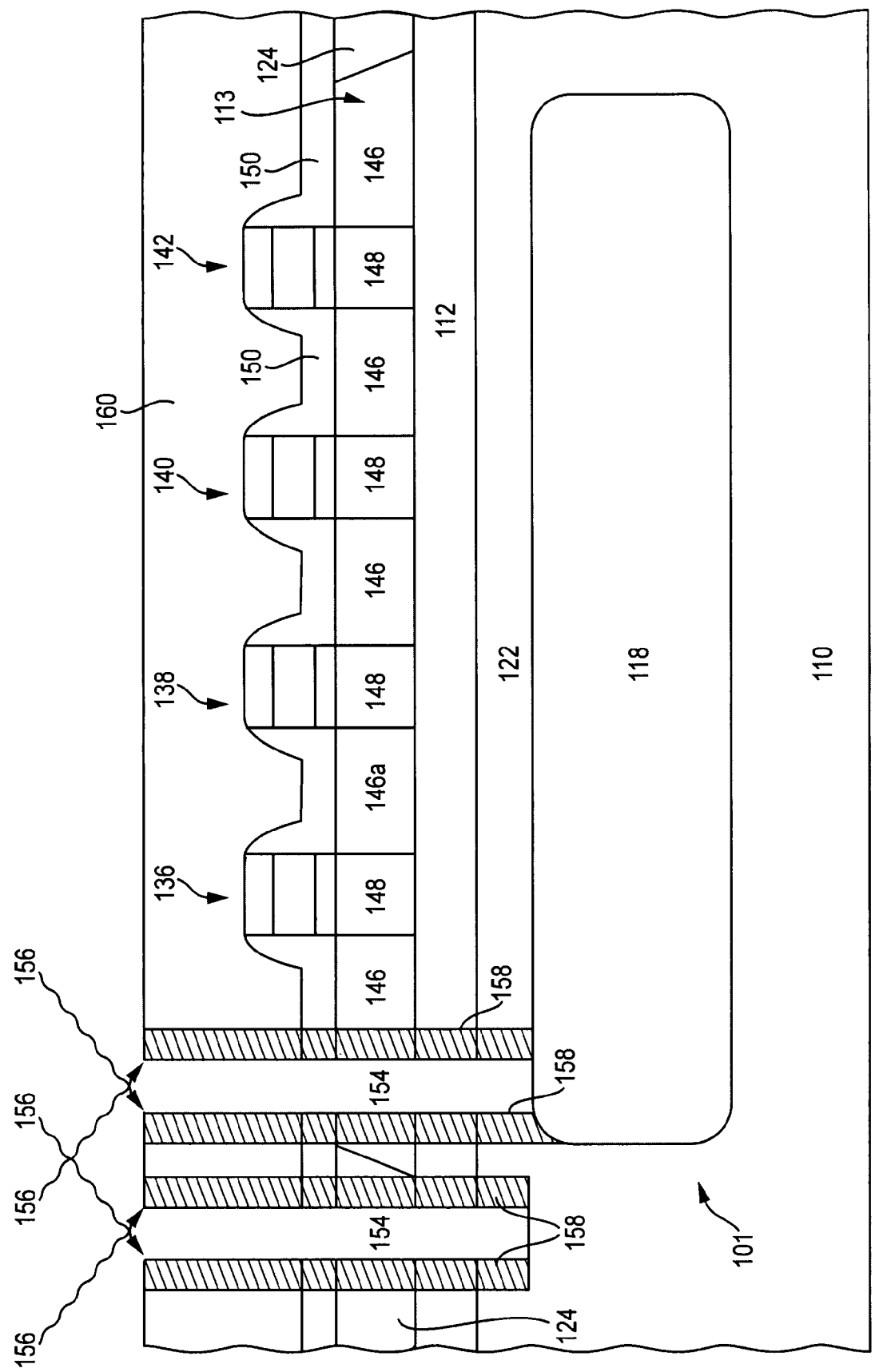

After forming the transfer transistor gate 136, the reset transistor gate 138, the source follower transistor gate 140, and the row select transistor gate 142, a protective layer 160 is formed over the wafer and planaraized, e.g., by CMP. Then, dual vias 154 are formed in the substrate 110, as shown in FIG. 8. The vias 154 are formed by patterning the wafer with photoresist 152 and anisotropically etching to the n-type region 118 of the photodiode 101 and to an adjacent region of the wafer below the STI (or, e.g., diffused isolation) region 124. Vias (not shown) for contacts to the pixel circuitry can also be formed at this time. An angled implant 156 of p-type dopant, e.g., FIG. 3 shows the contacts 162 and 164 to the photodiode of the pixel 100. As shown, contact 162 fills a via 154 and penetrates the substrate at the source/drain region 146 of the transfer transistor (gate 136), through the BOX 112, through the p-type layer 122 of the photodiode, and terminating at the n-type region 118 of the photodiode. The contact 162 hooks the substrate to the photodiode 101, making it pinned, by its connection with the second contact 164 through the conductive strap 166. The second contact 164 also penetrates the substrate and BOX 112, but through the STI 124 (or other isolation feature, e.g., diffused isolation region or field oxide formed by LOCOS). These contacts 162 and 164 are surrounded by p-type doped regions 158, which can be formed by boron implantation.

Over the transistor gates (136, 138, 140, 142), FIG. 3 shows a transparent and dielectric protective layer 160. Protective layer 160 may be a layer of BPSG, PSG, BSG, silicon dioxide, silicon nitride, polyimide, or other well-known light transmissive insulators. Contacts 168, 172, and 176 to the transistors are formed in vias in this protective layer 160 to the floating diffusion region 146a and source/drain regions 146 of the transistors. Interconnects 170 (between the floating diffusion region 146a and the source follower transistor gate 138), 174 (between the reset transistor and a voltage source), and 178 (from the row select transistor to read-out circuitry) are provided over the protective layer 160 in electrical communication with the contacts 168, 172, and 176, respectively. Over these interconnect layers can be formed additional light transmissive protective layers and lenses (not shown), as is known in the art.

Although the pixel 100 has been primarily described above such that in operation it receives light from the side of the wafer above the pixel circuitry, this is not necessarily required and it is possible to adjust the positioning of the photodiode 101 so that the pixel 100 receives and senses light from the opposite side of the wafer. Therefore, in an alternative embodiment, the n-type region 118 is spaced deeper in the substrate 110 so that it is at a suitable depth to sense light from the side of the wafer opposite the BOX 112 and silicon layer 113.

Figure 4:
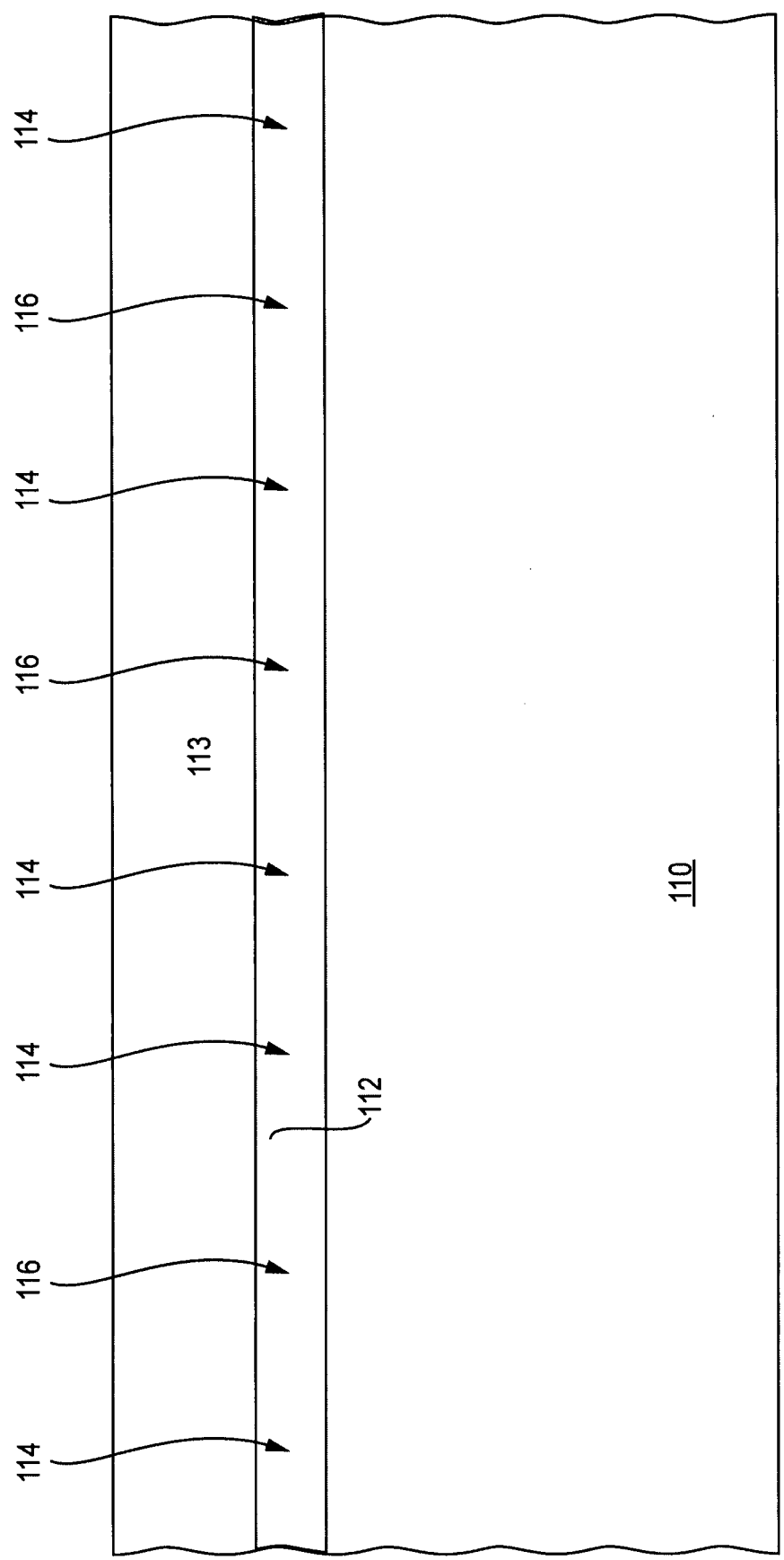
FIGS. 4-8 show a pixel, as shown in FIG. 2, at various stages of fabrication, in accordance with the invention.

The pixel 100 can be fabricated as one of an array of like pixels by steps as shown in FIGS. 4-8. As shown in FIG. 4, processing can begin by providing a semiconductor wafer 110, which is preferably silicon. A BOX 112 (buried oxide) is formed by SIMOX (separation by implantation of oxygen). Oxygen (or nitrogen) is implanted 114 into the substrate 110

(typically about $10^{15}$ to about $10^{18}$ ions cm$^{-2}$) at a depth of about 500 Å or less to about 5,000 Å or more (depth of the BOX 112 determines thickness of overlying silicon) and at an elevated temperature (typically about 400° C. to about 600° C.). An annealing process (typically about 900° C. to about 1,400° C.), which can be carried out in a high temperature furnace, converts the implanted oxygen into silicon oxide (or nitrogen into silicon nitride) and thereby forms the BOX 112, which can typically be about 2,000 Å to about 3,000 Å thick. If it is desired that the BOX 112 be rich in some element, e.g., boron, fluorine, or deuterium, to achieve certain characteristics in the resulting pixel, it is implanted 116 at the proper depth. As indicated above, a boron-rich BOX 112 will provide a p-type layer 122 for the photodiode; a deuterium or fluorine-rich BOX 112 will aid in passivation of the semiconductor wafer.

Figure 1A:
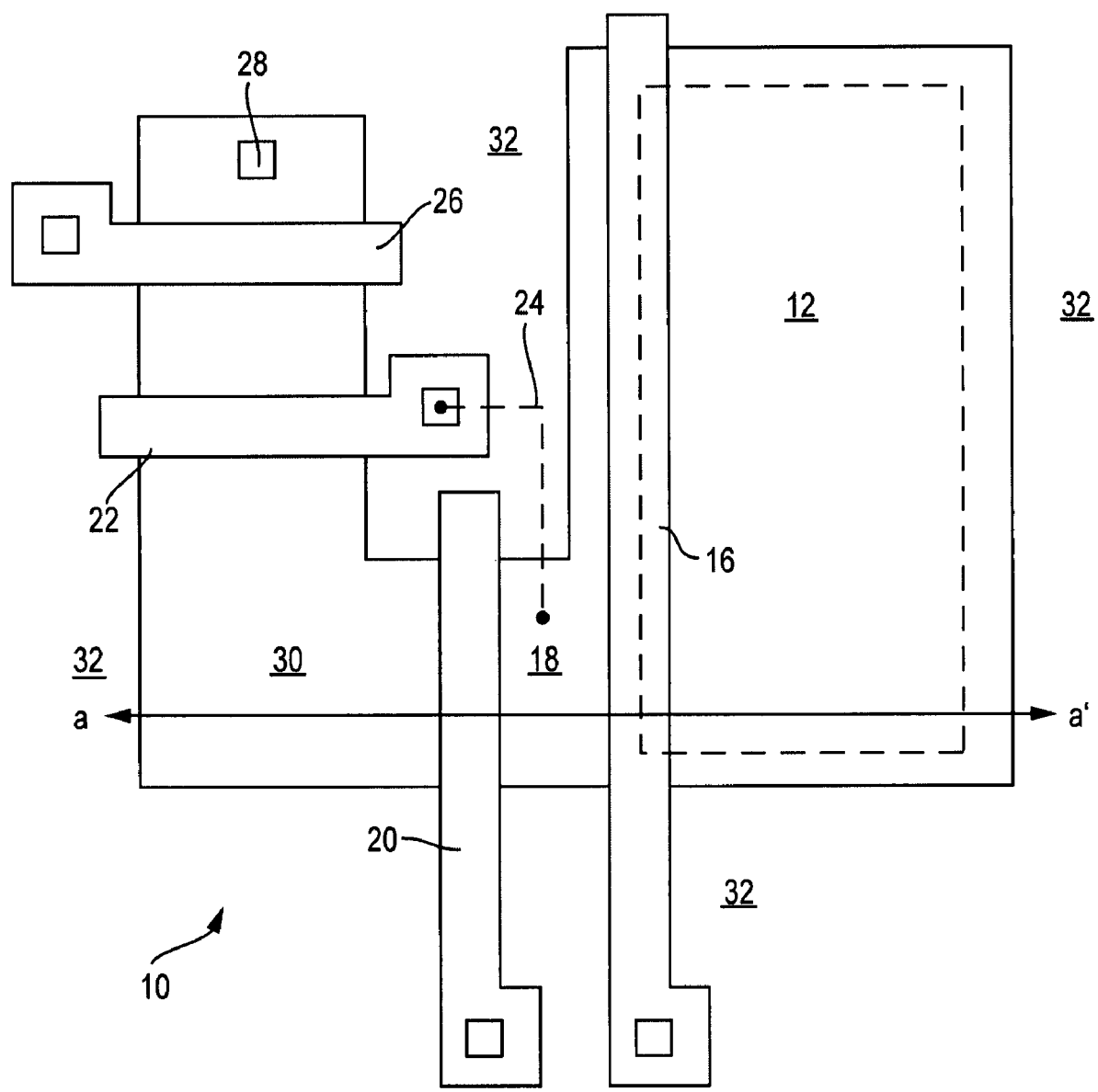
FIG. 1a shows an overhead view of a typical prior art CMOS imager pixel.
Figure 1B:
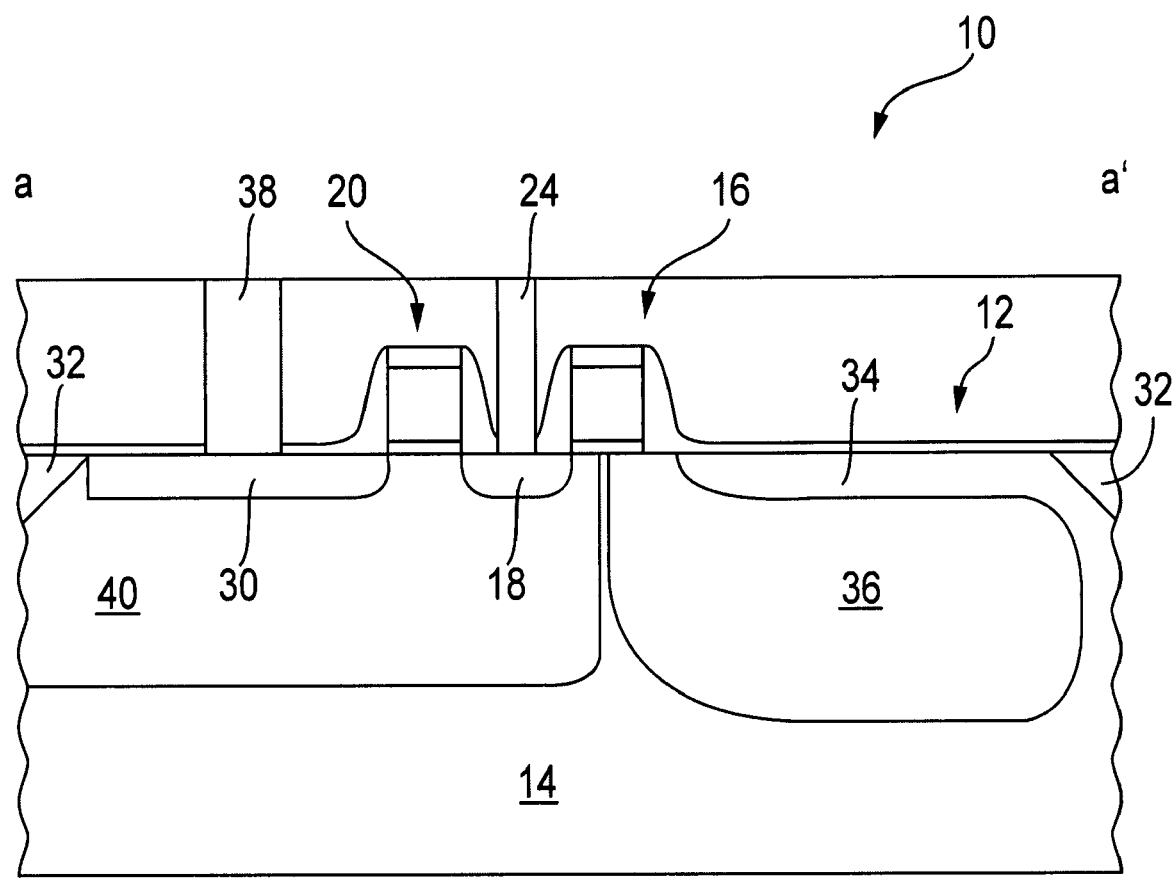
FIG. 1b shows a cross-section view of a pixel as shown in FIG. 1 through line a-a'.
Figure 5:
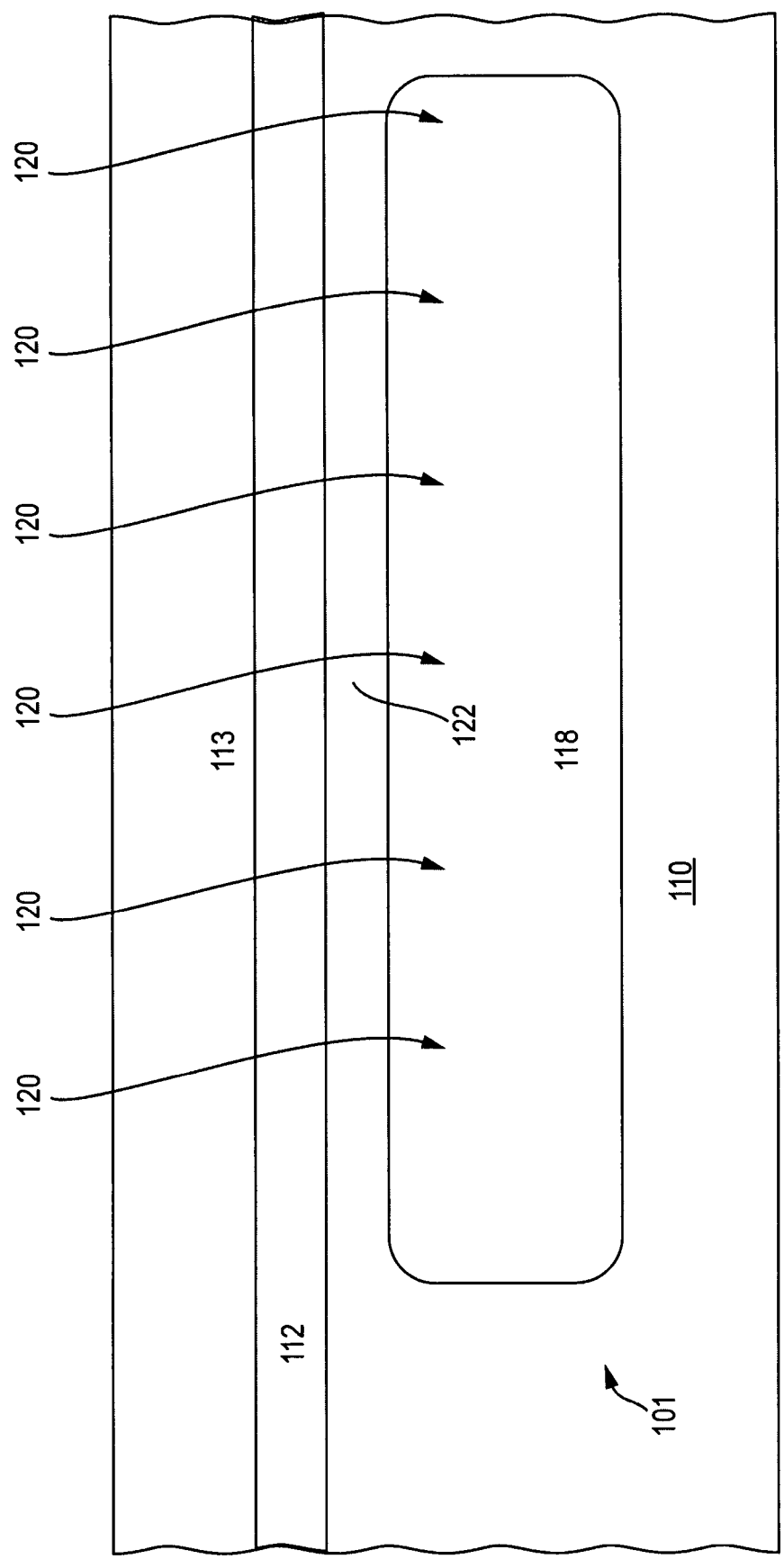

As shown in FIG. 5, after formation of the BOX 112, implantation 120 of an n-type dopant, e.g., phosphorus, creates an n-type region 118 below the BOX, which will serve as the primary charge collection body of the photodiode 101 of the pixel cell 100. For a pixel 100 in accordance with the invention, having a BOX 112 thickness of about 2,000 Å to about 3,000 Å and a silicon layer 113 thickness of about 1,000 Å to about 1,500 Å, an implant energy in the range of about 500 keV to about 3 MeV can be used. The substrate 110 is masked with, e.g., photoresist (not shown), for implantation 120; the photoresist is then removed. Unlike conventional pixel designs (FIGS. 1a and 1b) and even other pixel designs utilizing SOI technology, here the n-type region 118 of the photodiode 101 substantially (or totally) spans (up to 95% or more) the entire area of the pixel 100. This large photodiode 101 area provides for an increased fill factor for the pixel 100. If the BOX 112 is boron-rich, a p-type layer 122 is formed over the n-type region 118 by the diffusion of boron from the BOX 112 into the substrate between the n-type region 118 and the BOX 112. If the BOX 112 is not boron-rich, an implantation step may be employed, e.g., using boron, to create the p-type layer 122 below the BOX 112.

Figure 6:
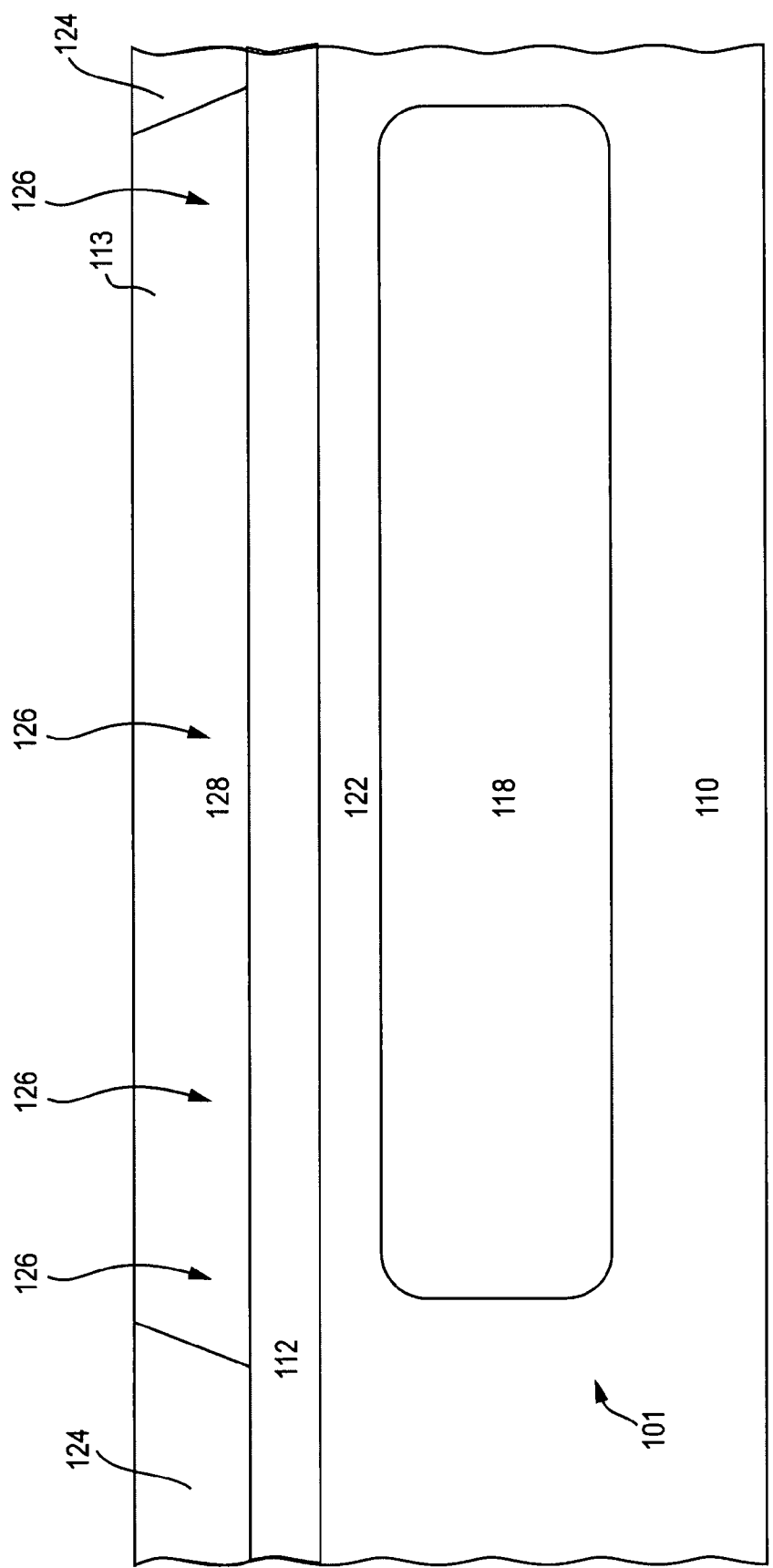

As shown in FIG. 6, after formation of the BOX 112 and photodiode regions (n-type 118 and p-type 122), STI (shallow trench isolation) regions 124 are formed in the silicon layer 113 over the BOX 112 and surrounding the portion of the wafer dedicated for the pixel 100. The STI (or other isolation) regions 124 isolate the pixel 100 from other like cells. If STI regions 124 are used, they are formed by etching the silicon layer 113 to the BOX 112. After etching, a boron implant can be utilized to p-type dope the sidewalls of the STI regions 124. The etched regions of the substrate are filled with an insulating material, such as silicon oxide. Removal of excess insulating material and wafer planarization can be accomplished here by, e.g., CMP. As an alternative, region 124 can be a diffused isolation region formed by concentrated implantation of p-type dopant around the pixel 100. A diffused isolation region mitigates dark current in the pixel boron, is performed to form doped sidewalls 158 of the vias 154. This is followed by forming contacts 162 and 164 (as well as 168, 172, and 176, FIG. 3) by deposition, e.g., by sputtering, and defining, e.g., etching-back or CMP. The conductive strap 166 and interconnect lines 170, 174, and 178 are formed, e.g., by sputtering, patterning and etching, resulting in the pixel cell 100 as shown in FIG. 3. As discussed above with reference to FIGS. 2 and 3, contacts 162 and 164 can be a variety of conductive materials, such as aluminum, tungsten, titanium, and doped poly. The conductive strap 166 and interconnect lines 170, 174, and 178 can also be a variety of conducive materials, such as tungsten, copper, gold, silver, aluminum and doped poly.

Figure 9:
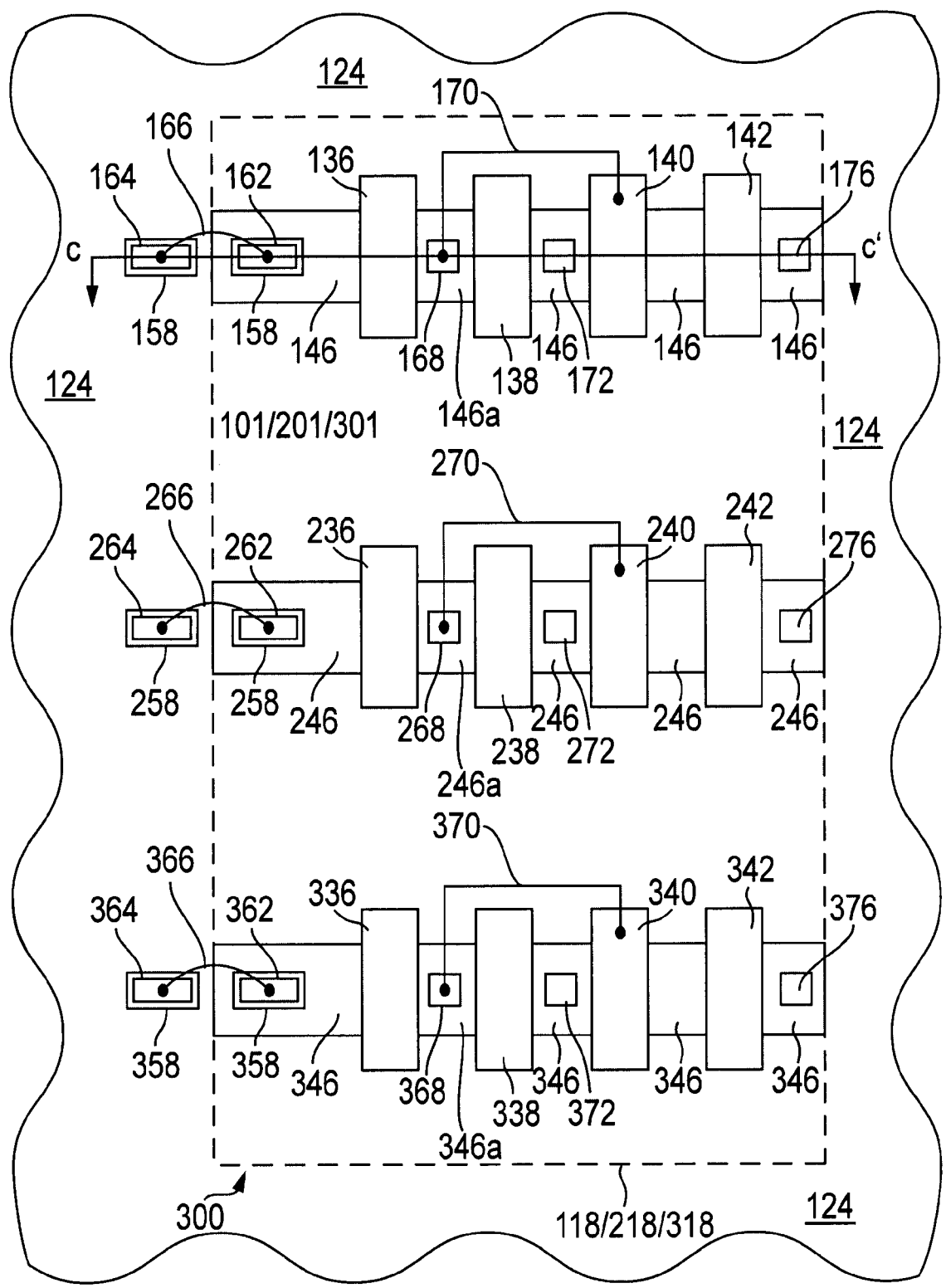
FIG. 9 shows a pixel for sensing multiple colors in accordance with an embodiment of the invention.

An alternative embodiment of the invention is shown in FIG. 9, which shows a pixel 300 similar to pixel 100 shown in FIG. 2 and 3; however, pixel 300 is a multicolor pixel having at least two photodiodes (e.g., 101 and 301) for sensing at least two light wavelength ranges, e.g., red and blue. Pixel 300 is shown having three photodiodes (i.e., 101, 201, and 301), represented by their n-type regions 118, 218, and 318. The three photodiodes 101, 201, and 301 of pixel 300 can be used to sense blue, green, and red light. FIG. 9 shows an exemplary layout for the circuitry for each of these photodiodes 101, 201, and 301. As with pixel 100 of FIG. 2, the photodiodes 101, 201, and 301 of pixel 300 substantially span the entire pixel area across the wafer, providing a large fill factor.

The first photodiode 101, having n-type region 118 and p-type layer 122 (FIG. 10), is associated with circuitry like pixel 100 of FIG. 2, as shown by the like reference numbers. The second photodiode 201, having n-type region 218 and p-type layer 222 (FIG. 10), is connected by contact 262 to transfer transistor gate 236 by the proximate source/drain region 246.

Also associated as circuitry for the second photodiode 201 is a reset transistor gate 238, a source follower transistor gate 240, and a row select transistor gate 242, and proximate source drain regions 246. The second photodiode's 201 floating diffusion region 246a has contact 268 connected by interconnect line 270 with the source follower transistor gate 240. Between the reset transistor gate 238 and the source follower transistor gate 240 is contact 270, which is connected with a voltage source (e.g., $V_{aa}$). Proximate the row select transistor gate 276 is contact 276, which is connected to signal readout circuitry.

The third photodiode 301, having n-type region 318 and p-type layer 322 (FIG. 10), is connected by contact 362 to transfer transistor gate 336 by the proximate source/drain region 346.

Associated as circuitry for the third photodiode 301 is a reset transistor gate 338, a source follower transistor gate 340, and a row select transistor gate 342, and proximate source drain regions 346. The third photodiode's 301 floating diffusion region 346a has contact 368 connected by interconnect line 370 with the source follower transistor gate 340. Between the reset transistor gate 338 and the source follower transistor gate 340 is contact 370, which is connected with a voltage source (e.g., $V_{aa}$). Proximate the row select transistor gate 376 is contact 376, which is connected to signal readout circuitry.

Figure 10:
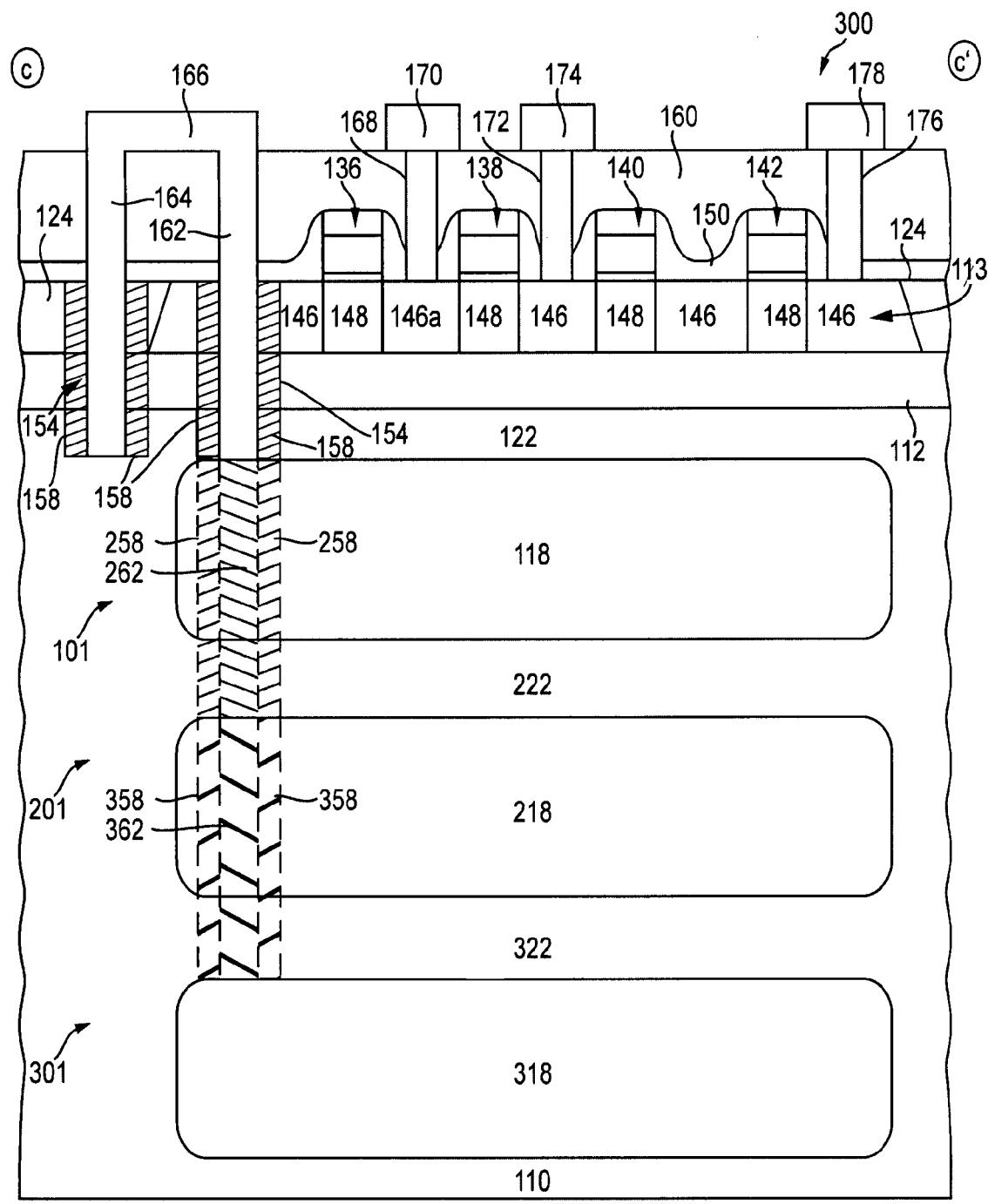
FIG. 10 shows the pixel of FIG. 9 in cross-section through line c-c'.

FIG. 10 shows the pixel 300 through cross-section c-c' and illustrates how the three photodiodes 101, 201, and 301 can be positioned with respect to each other and the pixel circuitry. As shown, photodiode 201 (having n-type region 218 and p-type region 222) is between photodiode 101 (having n-type region 118 and p-type region 122) and photodiode 301 (having n-type region 318 and p-type region 322). There need not necessarily be three photodiodes, but there must be at least two in this embodiment. If there are only two photodiodes (e.g., 101 and 301), they can be positioned in the substrate 110 so that, for example, one senses blue light at a substrate depth of about 0.5 µm to about 1.0 µm and one senses red light at a substrate depth of about 2.0 µm to about 5.0 µm or greater; a second pixel (not shown) can then be utilized to sense green light at a substrate depth of about 1.5 µm. Other color sensing photodiode combinations (e.g., blue/green, red/green, etc.) are also possible. If three photodiodes 101, 201, and 301 are utilized, as shown in FIG. 10, they are stacked in the substrate 110 at the appropriate depths such that the n-type region 218 is positioned for sensing green light and one of the n-type regions 118 and 318 is positioned for sensing red light and the other is positioned for sensing blue light (with respect to the side of the wafer where light impacts the wafer, e.g., front-side or back-side).

The photodiodes 101, 201, and 301 of pixel 300 are connected to their associated circuitry in the same manner as that of pixel 100 in FIG. 3. Contact 262 (shown in hatching as it is not necessarily in the same plane as the rest of FIG. 10) extends lower in the substrate 110 than contact 162 and is formed to connect n-type region 218 with the source/drain region 246 (FIG. 9) of the transfer transistor gate 236. Contact 262 can be surrounded by a p-type region 258 of the substrate to mitigate dark current. Contact 362 (shown in less dense hatching than contact 262; also not necessarily in the same plane as the rest of FIG. 10) extends lower in the substrate 110 than contacts 162 and 262 and is formed to connect n-type region 318 with the source/drain region 346 (FIG. 9) of the transfer transistor gate 336. Contact 362 can be surrounded by a p-type region 358 of the substrate to mitigate dark current. Like contact 162, contacts 262 and 362 are dual contacts and are connected (FIG. 9) to conductive straps 266 and 366, respectively, and contacts 264 and 364, respectively.

Figure 11:
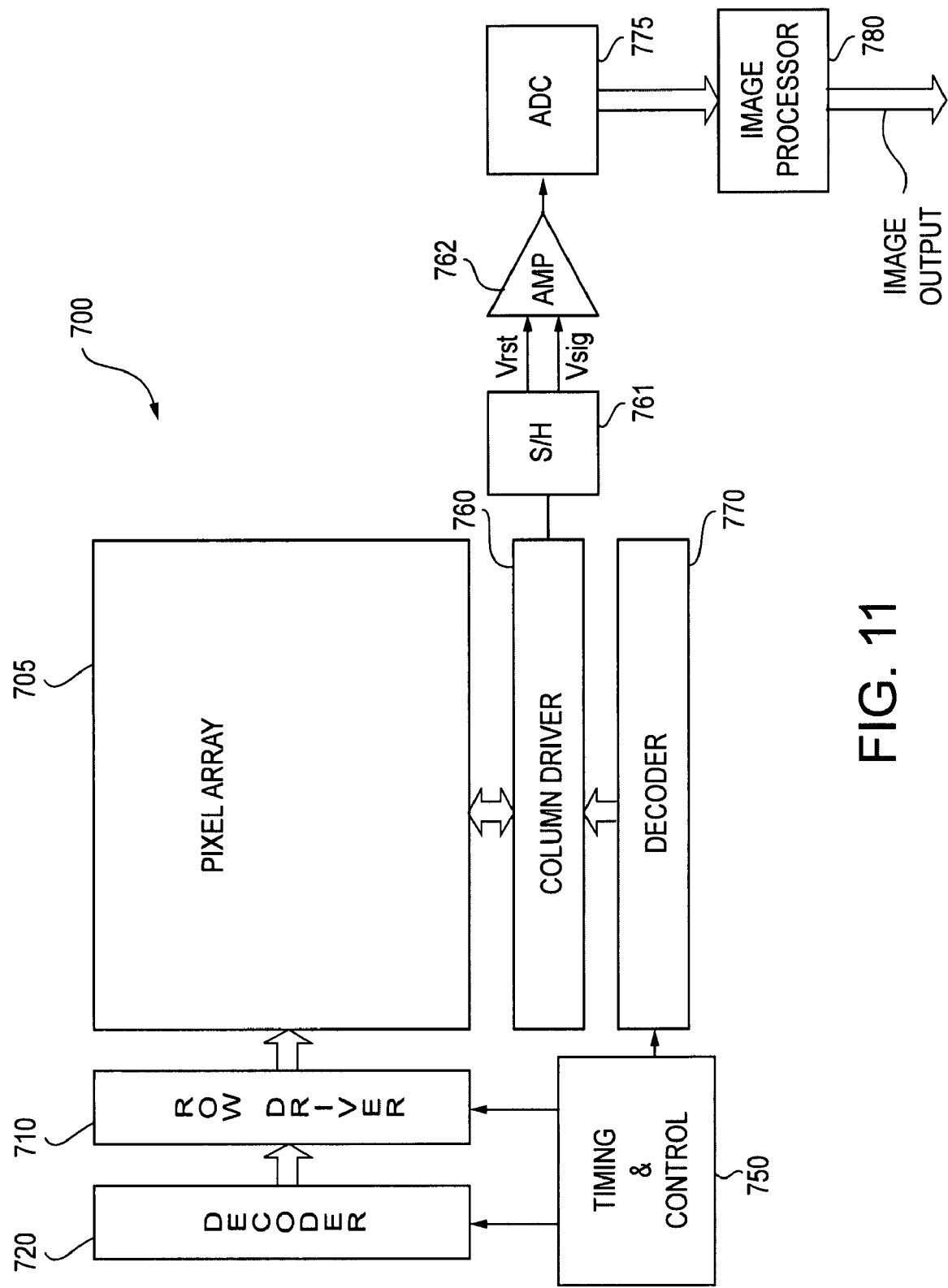
FIG. 11 shows an imager constructed in accordance with an embodiment of the invention.

FIG. 11 illustrates an exemplary imager 700 (i.e., image sensor) that may utilize any embodiment of the invention. The imager 700 has a pixel array 705 comprising pixels constructed as described above with respect to FIGS. 2, 3, 9 and 10 or using other pixel architectures. Row lines are selectively activated by a row driver 710 in response to row address decoder 720. A column driver 760 and column address decoder 770 are also included in the imager 700. The imager 700 is operated by the timing and control circuit 750, which controls the address decoders 720, 770. The control circuit 750 also controls the row and column driver circuitry 710, 760 in accordance with the invention.

A sample and hold circuit 761 associated with the column driver 760 reads a pixel reset signal $V_{rst}$ and a pixel image signal $V_{sig}$ for selected pixels. A differential signal ($V_{rst}$-$V_{sig}$) is amplified by differential amplifier 762 for each pixel and is digitized by analog-to-digital converter 775 (ADC). The analog-to-digital converter 775 supplies the digitized pixel signals to an image processor 780 which forms a digital image. The image processor 780 may also determine the gain setting of the imager 700, which can be used to set the level of the voltage applied to the pixels transfer transistor gates.

FIG. 12 shows a processor system 1000, which is a typical processor system modified to include an imaging device 1008 (such as an imaging device with a pixel as illustrated in FIGS. 2, 3, 9, and 10) of the invention. The processor system 1000 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system, and other systems employing an imager.

System 1000, for example a camera system, generally comprises a central processing unit (CPU) 1002, such as a microprocessor, that communicates with an input/output (I/O) device 1006 over a bus 1020. Imaging device 1008 also communicates with the CPU 1002 over the bus 1020. The processor-based system 1000 also includes random access memory (RAM) 1004, and can include removable memory 1014, such as flash memory, which also communicate with the CPU 1002 over the bus 1020. The imaging device 1008 may be combined with a processor, such as a CPU, digital signal processor, or microprocessor, with or without memory storage on a single integrated circuit or on a different chip than the processor.

Various embodiments of the invention have been described above. Although this invention has been described with reference to these specific embodiments, the descriptions are intended to be illustrative of the invention and are not intended to be limiting. Various modifications and applications may occur to those skilled in the art without departing from the spirit and scope of the invention as defined in the appended claims.

What is claimed as new and desired to be protected by Letters of Patent of the United States is:

1. An imager pixel, comprising:
   a silicon-on-insulator substrate comprising a lower substrate portion, a buried oxide over the lower substrate portion, and a silicon layer over the buried oxide;
   a photodiode in the lower substrate portion, wherein the pixel has an area dimension with respect to the substrate, and the photodiode substantially spans the entire pixel area dimension;
   a dual contact comprising a first contact plug to the photodiode and a second contact plug extending to the lower substrate portion adjacent the photodiode; and
   a conductive strap connecting the first contact plug with the second contact plug.

2. The imager pixel of claim 1, wherein the photodiode spans at least 95% of the pixel area dimension.

3. The imager pixel of claim 1, wherein the dual contact extends through the buried oxide layer and the silicon layer over the buried oxide layer.

4. The imager pixel of claim 3, wherein the second contact plug extends through an isolation region to reach the lower substrate.

5. The imager pixel of claim 4, wherein the first contact plug extends through a source/drain region of a pixel transistor.

6. The imager pixel of claim 3, wherein the substrate has a p-type conductivity region around the dual contact.

7. The imager pixel of claim 1, wherein the buried oxide is rich in at least one of boron, fluorine, and deuterium.

8. The imager pixel of claim 1, wherein the lower substrate portion is an n-on-n+ epitaxial material.

9. The imager pixel of claim 8, wherein a lower substrate portion is a graded n+ epi layer.

10. The imager pixel of claim 1, wherein the photodiode is configured to sense light impacting the lower substrate portion on a side thereof opposite the buried oxide and silicon layer.

11. The imager pixel of claim 1, further comprising at least one second photodiode, wherein each of the photodiode and the second photodiode comprises a respective charge collection region, the respective charge collection regions being positioned at respective depths within the substrate relative to a light source such that the photodiode senses a first color of light and the second photodiode senses a second color of light.

12. The imager pixel of claim 1, further comprising at least one second photodiode and at least one third photodiode, wherein each of the photodiode, the second photodiode, and the third photodiode each comprises a respective charge collection region, the respective charge collection regions being positioned at respective depths within the substrate relative to a light source such that the photodiode senses a first color of light, the second photodiode senses a second color of light, and the third photodiode senses a third color of light.

13. A CMOS imager, comprising:
a silicon-on-insulator substrate comprising a lower substrate portion, a buried oxide over the lower substrate portion, and a silicon layer over the buried oxide;
an isolation region in the silicon layer, the isolation region defining a pixel area;
a pinned photodiode in the lower substrate portion;
a pixel circuit comprising a plurality of transistors supported by the silicon layer;
a dual contact from a transfer transistor to a charge collection region of the photodiode, the dual contact having a first contact penetrating the lower substrate portion to the charge collection region and a second contact penetrating the isolation region and lower substrate portion adjacent the photodiode; and
a conductive strap connecting the first contact and the second contact of the dual contact.

14. The CMOS imager of claim 13, wherein the first contact extends through a source/drain region of the transfer transistor and the buried oxide to the charge collection region.

15. The CMOS imager of claim 13, wherein the buried oxide is rich in at least one of boron, fluorine, and deuterium.

16. The CMOS imager of claim 13, wherein the photodiode is configured to sense light impacting the lower substrate portion on a side of the lower substrate portion opposite the buried oxide and silicon layer.

17. A processor system, comprising:
an imager coupled to a processor, the imager comprising an array of pixels, each pixel comprising:
a silicon-on-insulator substrate comprising a lower substrate portion, a buried oxide over the lower substrate portion, and a silicon layer over the buried oxide; and
a pinned photodiode in the lower substrate portion, wherein the pixel has an area dimension with respect to the substrate and the photodiode substantially spans the entire pixel area dimension;
a first contact through the silicon layer and buried oxide to the pinned photodiode;
a second contact through the silicon layer and buried oxide to the lower substrate portion outside the pinned photodiode; and
a conductive strap connecting the first contact with the second contact.

18. The processor system of claim 17, further comprising a dual contact to the photodiode, wherein a first contact plug extends to the photodiode and a second contact plug extends to a region of the substrate adjacent the photodiode.

19. The processor system of claim 17, further comprising a shallow trench isolation region around the pixel.

20. The processor system of claim 17, further comprising a diffused isolation region around the pixel.

* * * * *